(12) United States Patent
Cockburn et al.

(10) Patent No.: US 7,500,103 B2
(45) Date of Patent: Mar. 3, 2009

(54) DATA PARSING AND TOKENIZING APPARATUS, METHOD AND PROGRAM

(75) Inventors: Gordon J Cockburn, Southampton (GB); Adrian John Hawes, Eastleigh (GB)

(73) Assignee: International Business Machines Corporation, Armonk, NY (US)

( * ) Notice: Subject to any disclaimer, the term of this patent is extended or adjusted under 35 U.S.C. 154(b) by 1029 days.

(21) Appl. No.: 10/806,723

(22) Filed: Mar. 23, 2004

(65) Prior Publication Data

US 2004/0264696 A1    Dec. 30, 2004

(30) Foreign Application Priority Data

Jun. 28, 2003    (GB)    .................... 0315152.9

(51) Int. Cl.
*H04L 9/00* (2006.01)
*G06F 7/04* (2006.01)
*H04N 7/16* (2006.01)

(52) U.S. Cl. ........................... 713/172; 713/159; 726/9; 726/20; 725/23

(58) Field of Classification Search .................... 380/37, 380/9, 49; 713/159, 172; 726/9, 20; 725/23
See application file for complete search history.

(56) References Cited

U.S. PATENT DOCUMENTS

| | | | | |
|---|---|---|---|---|
| 4,464,650 A | * | 8/1984 | Eastman et al. ................ | 341/51 |
| 5,150,430 A | * | 9/1992 | Chu ............................ | 382/246 |
| 5,532,693 A | * | 7/1996 | Winters et al. ................ | 341/51 |
| 5,612,693 A | * | 3/1997 | Craft et al. ..................... | 341/51 |
| 5,771,011 A |   | 6/1998 | Masenas ........................ | 341/51 |
| 5,778,255 A | * | 7/1998 | Clark et al. .................... | 710/68 |
| 5,929,791 A |   | 7/1999 | Masenas ........................ | 341/51 |
| 5,970,177 A |   | 10/1999 | Chinnock ..................... | 382/244 |
| 6,021,198 A |   | 2/2000 | Anigbogu et al. .............. | 380/9 |
| 6,693,567 B2 |  | 2/2004 | Cockburn et al. .............. | 341/51 |

FOREIGN PATENT DOCUMENTS

| WO | WO-03/096543 A1 | 11/2003 |
|---|---|---|
| WO | WO-03/096544 A1 | 11/2003 |

* cited by examiner

*Primary Examiner*—Nasser G Moazzami
*Assistant Examiner*—Mohammad W Reza
(74) *Attorney, Agent, or Firm*—Harrington & Smith, PC

(57) ABSTRACT

Apparatus for parsing and tokenizing a data stream comprises: a storage component to store a history buffer containing an unencoded version of a previously encoded string; a comparison component to compare a string from the input data stream with the unencoded version of at least one previously encoded string; a second storage component store: an indicator that at least two matches were found by the first comparison component, and tokens corresponding to the matches; a summing component to sum potential token lengths to provide total potential token lengths; a second comparison component to compare total potential token lengths; a selection component to select a match corresponding to a shortest total token length to represent the string from said input data stream; and an emitting component for emitting tokens representing the match corresponding to the shortest total token length. The tokens may be used in, for example, compression or encryption.

16 Claims, 8 Drawing Sheets

DATA PARSING AND TOKENIZING APPARATUS, METHOD AND PROGRAM

FIELD OF THE INVENTION

The present invention is in the field of data parsing and tokenizing, and more particularly in apparatus, methods and computer programs for performing efficient multi-byte parsing to select the optimal overall token length for an output encoding of the parsed and tokenized data. Embodiments may be used within such fields as encryption, compression and message digest generation.

BACKGROUND OF THE INVENTION

Adaptive data transform algorithms are well known in the field of data compression, encryption and message digest generation. In particular, the "history buffer" versions of these adaptive data transform algorithms, for example the Lempel-Ziv 1 (or LZ1) compression algorithm, have become particularly popular in hardware implementations where their relatively modest buffer requirements and predictable performance make them a good fit for most underlying technologies.

The LZ1 algorithm works by examining the input string of characters and keeping a record of the characters it has encountered. Then, when a string appears that has occurred before in recent history, it is replaced in the output string by a "token": a code indicating where in the past the string has occurred and for how long. Both the compressor and decompressor must use a "history buffer" of a defined length, but otherwise no more information need be passed between them.

Like many compression and other data transform algorithms, LZ1 describes the format of the compressed data, rather than how the compression should be performed. It is quite common for two or more LZ1 compressed data streams of different lengths to decompress to the same data; therefore any valid compressed data stream is not necessarily coded in its most efficient (i.e. most compressed) form. The same applies to data streams that have been encrypted using adaptive transform to increase the entropy of the information. In many cases, there are efficiencies to be gained by optimization of the overall length of the tokens used to encode the data.

Some variations in the basic LZ1 algorithm have emerged, in particular using variable-length tokens to improve coding efficiency. For the purposes of this description, the variation known as IBMLZ1 will be used, but any version of the LZ1 algorithm would serve equally well. It will be clear to one skilled in the data processing art that many adaptive data transforms for encryption and for message digest generation exhibit the same need for optimal economy in parsing and tokenizing their respective input data streams.

The traditional method of finding occurrences of input strings in a history buffer in, for example LZ1 compression, can be described as "greedy" parsing. This is because the conventional parsing method always prefers the longest candidate string for encoding.

For example, suppose the history buffer contains the words "consensus" and "contagious", and a new string, "contact" appears for processing (as shown in FIG. 5). The first three letters, "con", will be matched with both strings in the buffer, and both will be regarded as candidates for substitution.

But the fourth letter, "t" matches only with "contagious", and so "consensus" is abandoned as a potential replacement pointer. The fifth letter, "a" also matches with "contagious", but the match fails at the sixth, "c". Thus the matched string terminates at this point, and a pointer to the string "conta" is substituted in the output stream. Thus the parser (the apparatus or process that compares input characters with the contents of the history buffer and finds the best match) has been greedy in using the longest string it could find.

If the parser processes input bytes one at a time, as is the case in conventional LZ1 processing, then the greedy algorithm is the best to use. The longer the encoded string, the greater the compression. However, another reason for describing it as greedy is that it has chosen the first string it could find.

Co-pending PCT patent application number WO/GB03/00384, assigned to the same assignee, describes a hardware method of implementing LZ1 compression that processes an indefinite number of bytes per cycle. A further refinement providing a reduced gate cost and capable of processing three bytes per cycle is disclosed in co-pending PCT patent application number WO/GB03/00388, assigned to the same assignee.

However, these and all the parsers presently known in the art employ the greedy algorithm described above. Although this algorithm is best in the single-byte situation, there are many circumstances in which it does not produce optimum compression.

The Applicant believes that it would be desirable to alleviate this problem by providing an improved parser capable of providing greater compression efficiency.

SUMMARY OF THE INVENTION

The present invention accordingly provides, in a first aspect, an apparatus for parsing an input data stream comprising: a first storage component operable to store a history buffer for containing an unencoded version of at least one previously encoded string; a first comparison component operable to compare a string from said input data stream with said unencoded version of said at least one previously encoded string; a second storage component operable to store: an indicator that there exist at least two matches found by said first comparison component, and tokens corresponding to said at least two matches; a summing component operable to sum potential token lengths to provide total potential token lengths; a second comparison component operable to compare said total potential token lengths; a selection component operable to select a match corresponding to a shortest total token length to represent said string from said input data stream; and an emitting component for emitting tokens representing said match corresponding to a shortest total token length.

Preferably, said apparatus comprises a data compression apparatus.

Preferably, said apparatus comprises an adaptive dictionary based data compression apparatus.

Preferably, said apparatus comprises a Lempel-Ziv data compression apparatus.

Preferably, said apparatus comprises a data encryption apparatus.

Preferably, said apparatus comprises a message digest generation apparatus.

In a second aspect, the present invention provides a method for parsing an input data stream comprising: storing a history buffer for containing an unencoded version of at least one previously encoded string; comparing a string from said input data stream with said unencoded version of said at least one previously encoded string; storing: an indicator that there exist at least two matches found by said first comparison component, and tokens corresponding to said at least two matches; summing potential token lengths to provide total potential token lengths; comparing said total potential token lengths; selecting a match corresponding to a shortest total token length to represent said string from said input data stream; and emitting tokens representing said match corresponding to a shortest total token length.

Preferably, said tokens comprise compressed data corresponding to said at least two matches.

Preferably, said compressed data comprises adaptive dictionary based compressed data.

Preferably, said tokens comprise encrypted data corresponding to said at least two matches.

Preferably, said tokens comprise message digest data corresponding to said at least two matches.

In a third aspect, the present invention provides a computer program element comprising computer software code portions for performing the method of the second aspect when the program element is executed on data processing means.

In a fourth aspect, the present invention provides a memory device storing computer software code portions for performing the method of any one of claims 1 to 11 when the code portions are executed on data processing means.

BRIEF DESCRIPTION OF THE DRAWINGS

A preferred embodiment of the present invention will now be described, by way of example only, with reference to the accompanying drawings, in which.

DETAILED DESCRIPTION OF THE PREFERRED EMBODIMENT

For better understanding of the preferred embodiment of the present invention, the disclosure of co-pending PCT patent application number WO/GB03/00384 must be presented here to describe an exemplary system and method for multi-byte Lempel-Ziv compression within which the preferred embodiment of the present invention may be implemented, although the embodiments of the present invention are not limited thereto. The disclosure of the co-pending patent application is described herein with reference to FIG. 1 to 4.

The apparatus and method of the co-pending application is described in the context of an LZ1 variant attributed to IBM and known as "IBMLZ1", but it will be understood by one skilled in the art that the technique presented is applicable to all versions of the LZ1 algorithm, and also to other versions of the Lempel-Ziv compression method. This technique is expandable to any number of bytes per cycle, or any length of history buffer, but it will be described here using a 12-byte-per-cycle design with a 512-byte history buffer.

Figure 1:
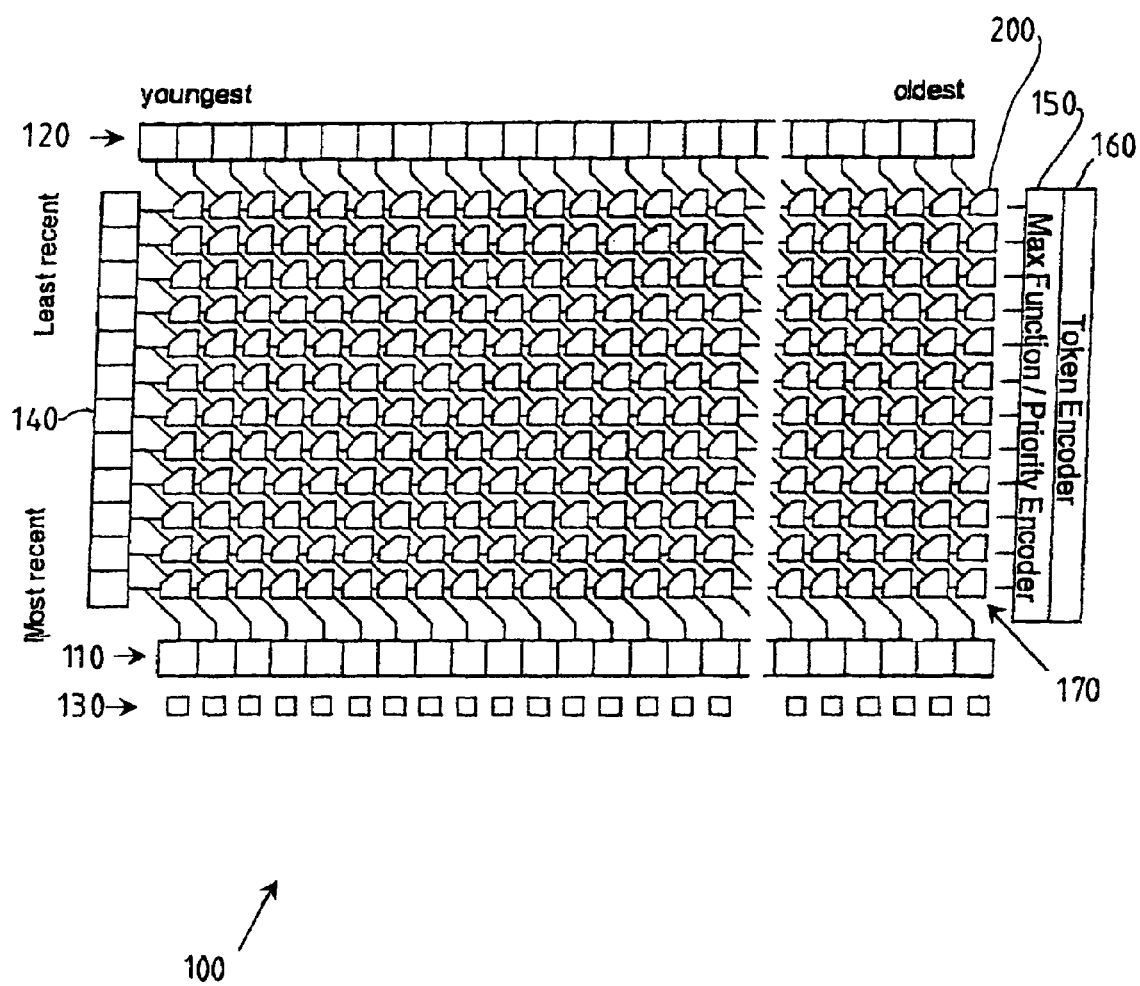
FIG. 1 shows a block schematic diagram of a comparison matrix used in a compression arrangement utilising the multi-byte compressor of co-pending PCT patent application number WO/GB03/00384.

Referring now to FIG. 1, a compression arrangement 100 includes two groups (L1 and L2) of 512-byte latches 110 and 120, a group of 512 carry latches 130, a 12-byte input buffer 140, a MAX Function/Priority Encoder (MFPE) 150, a token encoder 160, and a 512-by-12 matrix array 170 of comparison units 200 (which will be described in greater detail below).

The L2 latches 120 are coupled respectively to 512 comparison units in the first row of the matrix 170, and to comparison units diagonally displaced successively by one unit to the right in each lower row of the matrix as will be explained in more detail below. The L1 latches 110 and associated carry latches 130 are coupled respectively to the 512 comparison units in the last row of the matrix 170.

The 12 bytes of the input buffer 140 are coupled respectively to the 12 rows of comparison units in the leftmost column of the matrix 170. The MAX Function/Priority Encoder 150 and token encoder 160 are coupled to the 12 rows of comparison units in the matrix 170.

The 12 input bytes have to be compared with the entire history buffer, in the search for matches. However, some of the input bytes themselves constitute part of the "history". A 12-byte input buffer must assume that each byte is in chronological order, even though they all enter in one cycle.

Therefore one end of the input buffer is considered "most recent", and the other "least recent", as if the "least recent" bytes entered the process first. Each byte must consider those in the input buffer that are "less recent" to be part of the history, and be compared accordingly.

The manner in which the input bytes are compared, both with the bytes in the history buffer and the less recent bytes in the input buffer, is shown in FIG. 1. Considering the input buffer 140 on the left of the diagram, if the processing were the conventional type—one byte at a time—then the top byte would be the first in and the bottom byte the last; however, in this implementation the bytes are all input at the same time. As can be seen, the outputs of the input buffer—all 12 input bytes—are connected to the inputs of all comparison units 200 in each row of the matrix 170. In each clock cycle the contents of the history buffer—all 512 bytes of it—are fed down for comparison with the first (least recent) byte of the input buffer, and then diagonally down and across for comparison with the most recent byte of the input buffer.

It will be understood that, as every byte of the history buffer must be available at once, conventional RAM cannot be used for the history buffer. In this implementation the history buffer is constructed using registers, arranged as level sensitive scan design (LSSD) L1-L2 pairs. At the end of each clock cycle the 12 input bytes are shifted into the history buffer, the old contents of the history buffer are shifted along (to the right as shown in FIG. 1) by 12 bytes, and the oldest 12 bytes are discarded.

Figure 2:
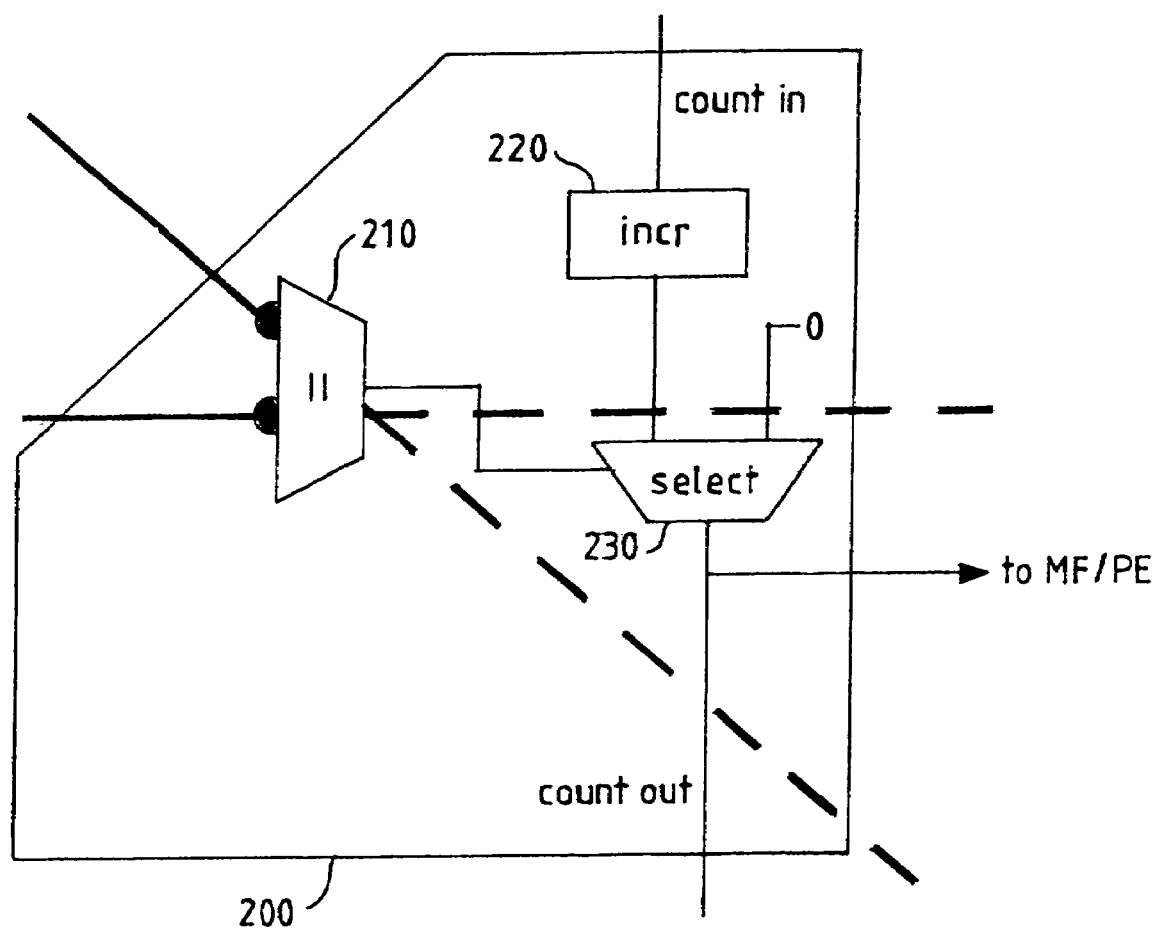
FIG. 2 shows a block schematic diagram illustrating in detail a comparison unit of the compression arrangement of FIG. 1.

The comparison units 200, represented by clipped squares in FIG. 1, are a fundamental element of this design. An expanded diagram of a comparison unit is shown in FIG. 2. It is the job of each block to compare the values of the two input bytes, tally up the count of matched bytes, and report a winning match to control logic.

A comparison unit 200 in the matrix 170 includes a byte comparator 210 arranged to receive for comparison a byte value from the input buffer byte position for that row and a history buffer byte value passed from a unit diagonally left and above. An incrementer 220 is arranged to receive and increment by '1' a 'count in' value from a unit directly above in the same column of the matrix. A selector 230 is arranged to receive the incremented count value and a '0' value and to select between these in dependence on the output of the comparator 210. If the comparator 210 indicates a match, the selector 230 outputs the incremented count value; otherwise it outputs a '0' value. The output of the selector is passed as a 'count out' value to a unit directly below in the same column; the selector output is also passed to MFPE for the same row of the matrix. As shown by the thick dashed lines, the byte values input to the selector 210 are passed to a unit directly to the right in the same row and to a unit diagonally below and right.

FIG. 2 shows that in addition to the byte to be compared, the unit 200 takes as input the "count" from the unit above, which indicates the length of the string seen thus far, and the byte for the same row of the input buffer 140. If the two input bytes match, then the comparison unit will increment that count, and pass the new count to the unit below it. If the two bytes do not match then the output count will be set to zero, regardless of the input count value.

The value of this count is also output from the right-hand side of each comparison unit, and is fed to the "MAX Function/Priority Encoder" (MFPE) logic 150 at the end of the row. There is one of these MFPE units for each of the twelve rows of the compressor 100. The function of the MFPE is to decide which comparison unit(s) 200 of the 512 in that row reported the longest string (i.e., the largest count—the MAX function), and to encode the position within the row. If more than one column produces the same large count then the MFPE encodes (arbitrarily) the left-most value (the priority encoding function). However, it may be noted that the value produced by the MFPE is not necessarily the string that will be encoded, as the string may continue beyond that row. The MFPE described here is an implementation of the greedy parsing function as described in terms of the prior art greedy algorithm above.

String matches that are still alive in row 12 (the last row of the matrix 170) may continue into the next cycle. The carry latches 130 at the bottom of FIG. 1 store the position of any surviving strings from this row. (The length of that string—the "count"—is stored in a separate single register, not shown.) The carry is fed into the "count input" to the first row of comparison units in the next cycle. It may be noted that there is a limit to the string length that can be encoded by the LZ1 algorithm, imposed by the number of bits in the token. (In IBMLZ1 the limit is 271 characters.) When the maximum number is reached a token is emitted and the string must start from zero. It will be appreciated that the token encoder 160 operates in the same manner known in the prior art and its structure and function need not be described in any further detail.

The largest string values for each row (reported by the MFPE 150) and their encoded positions are fed to the Token Encoder (TE) 160. The TE examines the reported lengths for each row, and decides where strings can be encoded for this batch of 12 input bytes. Where strings are to be encoded, the TE uses the positions reported by the MFPE as part of the token, along with the string length. Note that the length may rise to more than 12, when a long string spans more than one cycle. When this happens, the count is accumulated in the TE, ready for coding when the string terminates.

If no strings are found (noting that a match of just one byte is not worth encoding) or if some of the 12 bytes cannot be matched, then the TE must output literals. For this the TE takes data directly from the input buffer 140.

Figure 3:
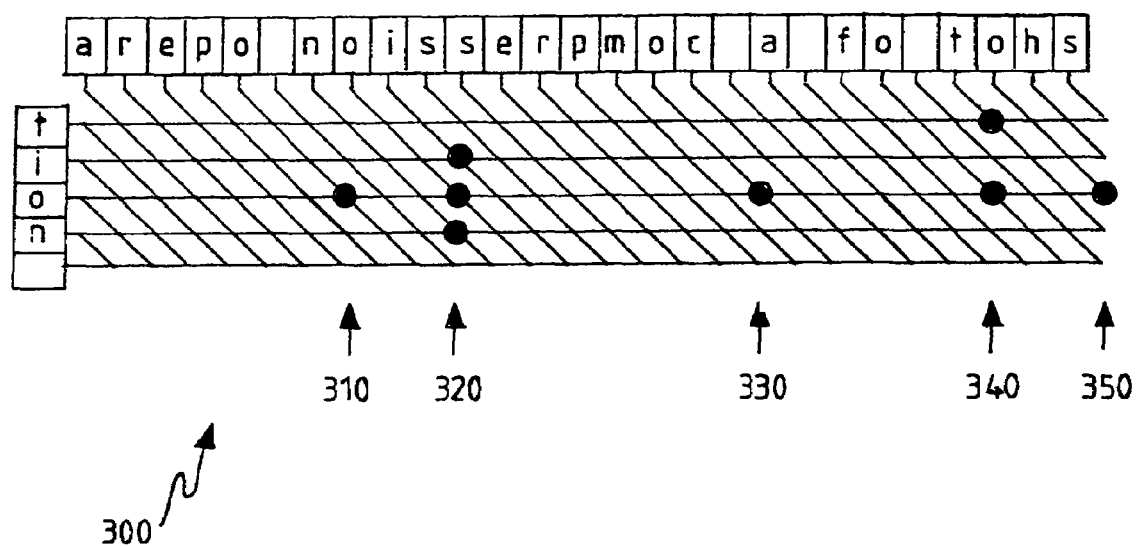
FIG. 3 shows a schematic diagram illustrating compression operation in the compression arrangement of FIG. 1.

FIG. 3 shows a snapshot of a compression operation 300. The previous sentence is used as input, and for simplicity only 5 input bytes and 27 history buffer bytes are shown. The filled circles (at columns 310, 320, 330, 340 and 350) indicate where a match is detected; a useful string match can be seen at column 320 in the current input bytes "ion". It is the position of column 320 in the row that will be forwarded for encoding.

Figure 4:
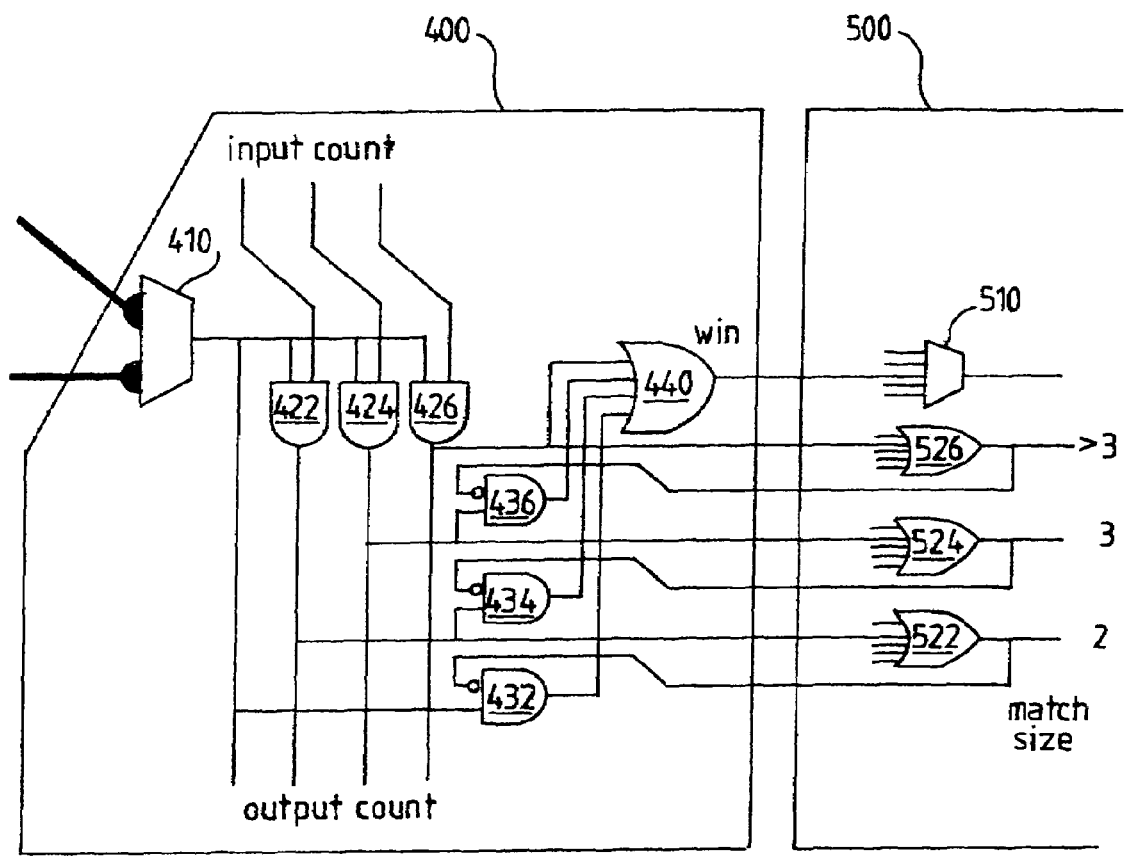
FIG. 4 shows a block schematic diagram illustrating in detail a particular implementation of a comparison unit matrix used in the compression arrangement of FIG. 1 and shown in schematic form in FIG. 2.
Figure 5:
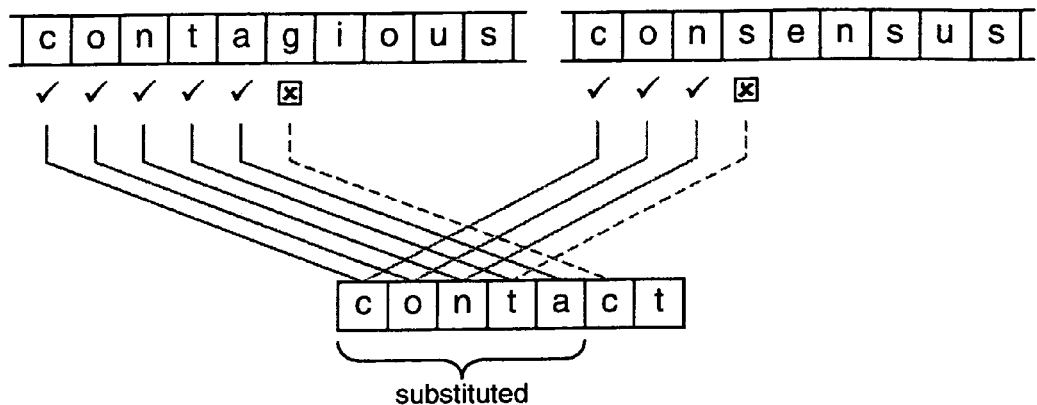
FIG. 5 shows an example of greedy parsing as used in known parsers according to the prior art.

A possible implementation 400 for the comparison unit is shown in FIG. 4. The comparison unit 400 (which as illustrated is a unit of row 3 of the matrix 170) has a comparator 410 which receives the two byte values to be compared as described above. Three AND gates 422, 424 and 426 each have one of their inputs connected to receive the output of the comparator 410, and have their other inputs connected to receive respective ones of three bit lines (carrying a 3-bit 'input count' value) from a comparison unit directly above in the same column. The outputs of the AND gates 422, 424 and 426, together with the output of the comparator 410, (carrying a 4-bit 'output count' value) are connected to a comparison unit directly below in the same column. The leftmost three of the 'output count' bit lines are connected respectively to inputs of three AND gates 432, 434 and 436. The outputs of the AND gates 432, 434 and 436, together with the output of the AND gate 426, are connected to inputs of a 4-input OR gate 440.

The output of the OR gate 440 (together with outputs of the other comparison units 400 in row 3 of the matrix 170) are connected, within an MFPE 500, to inputs of a 512-input priority encoder 510. Also within the MFPE 500, the outputs of the AND gates 422, 424 and 426 are connected (together with outputs of AND gates of other comparison units 400 in row 3 of the matrix 170) to respective inputs of 512-input OR gates 522, 524 and 526. The outputs of the OR gates 522, 524 and 526 are connected invertedly to inputs of the AND gates 432, 434 and 436 in each of the comparison units 400 in row 3 of the matrix 170.

The comparator 410 is the same as the comparator 210 in the comparison unit 200 described above, but in the comparison unit 400 the "count" is maintained by an N-bit vector. The bits of this vector are numbered 1 to N, and a count of "n" is represented by bits 1 to n being '1'. All other bits in the vector are '0'. Thus, a count of zero is shown by all bits being zero. This is a useful method of counting in this design because:

1. The number of bits required, N, need only be as large as the row number (row 1 needs only 1 bit, row 12 needs 12 bits), 2. The "count" is easily incremented, merely shifting to the right with a '1' fill, and 3. A MAX function is easily implemented, by ORing the respective bits of all the vectors together.

With a small amount of extra logic (in the form of the AND gates 432, 434 and 436 and the OR gate 440) in the comparison unit, the priority encoder is made simple also.

In operation of the comparison unit 400 of FIG. 4, this works as follows. The input count is represented by a 3-bit vector, which can indicate 4 values:

| Vector | Indicated Value | Indicated Match |
|--------|-----------------|-----------------|
| 000 | zero | |
| 001 | one | match in this column in row 2 |
| 011 | two | match in this column in rows 1 and 2 |
| 111 | more than two | match in this column in rows 1 and 2, and a carry |

If the comparator 410 detects a match in this column in this row (row 3), it will increment the count, producing a 4-bit vector 'output count' from the bottom of the unit. The incrementation will be achieved by effectively shifting the input vector right by one bit, adding a '1' at the left. If there is no match here, the AND gates 422, 424 and 426 are all turned off and the 'output count' collapses to zero.

A modified version of the 4-bit count is output to logic circuitry 510, 522, 524 and 526 in the MFPE 500 at the end of the row, also shown in FIG. 4. The three 512-input OR gates 522, 524 and 526 decide the maximum count for this row (the low-order bit is not used as it represents a count of only 1 byte). This maximum value is used to disqualify all counts smaller than the winning count, by means of AND gates 432, 434 and 436 in the comparison units 400 of the columns that do not contribute this maximum count. Those comparison units that show the maximum counts declare their candidacy on the encoder input, and the priority encoder codes the position of the leftmost of them. The "win" outputs of OR gates 440 in the comparison units of the bottom row comprise the 512 "carry" bits to be stored for the next cycle.

Although the above description has shown all operations happening in a single cycle, the design does not preclude some elements of pipelining. The critical factor is that the carry for each row must be successfully stored in one cycle, ready for inclusion in the next cycle's calculations.

The critical timing path—producing a valid carry for the next cycle—consists in this case of up to 12 AND gates (from a string of 12 matches), through a 512-input OR gate (which probably has several cascaded gates) and then through two more AND gates for the carry.

Thus, a total of some 20 gate delays determines the maximum operating frequency for this design. The 12 AND gate delays may be reduced by using look-ahead techniques, although this adds to the gate count.

It can be understood that comparison units 400 in the lower rows of the matrix 170 have proportionally more gates, and so it can be understood that the total number of gates increases with the square of the number of bytes processed per cycle.

Figure 6:
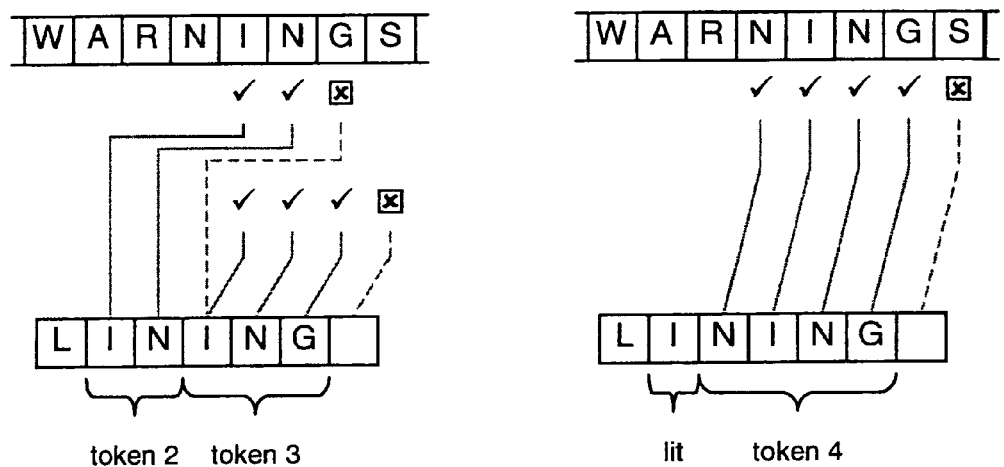
FIG. 6 shows an examples of how the greedy parser can fail to select matches giving an optimally short total token length and where there is a possible encoding that gives a shorter total token length.

Having described in some detail the disclosure of co-pending PCT patent application number WO/GB03/00384, consider now FIG. 6. In FIG. 6, the history buffer contains the string "WARNINGS" and the input to be processed contains the string "LINING". The left of the diagram shows the conventional parsing, processing one byte at a time and accepting the first viable match. The first "IN" in "LINING " has matched with the "IN" in "WARNINGS", yielding a token representing length 2. For the remainder of "LINING " the "ING" has matched with the end of "WARNINGS", giving a token of length 3. The IBMLZ1 coding scheme uses 12-bit tokens to represent strings of length 2 or 3, so good compression has been achieved in replacing the original 40 bits of "INING" with a total of 24 bits.

However, the right half of FIG. 6 shows that this can be bettered. Looking beyond just the current byte reveals that a longer match,—"NING"—exists within the input string. This match length of 4 generates a token of 14 bits, which reduces the representation of "INING" to 23 bits, even allowing for the "I" having to expand to a 9-bit literal. The greedy parser did not see this, because the match of the first "IN" inadvertently consumed the "N" of "NING", making that match invisible. Traditional one-byte-per-cycle hardware LZ1 can never see this other match, because any new matches are suppressed while a string match continues.

A parser according to the preferred embodiment of the present invention, however, can examine more than one byte per cycle, and is adapted to count the cost of any alternative encodings as shown in the figure and to select that which gives the shortest total token length. Such a parser, rather than being greedy as in the prior art is "smart".

It can be seen that the "smart" parser may be able to achieve an overall gain by sacrificing or shortening one substitution, and thereby allowing a longer one to go ahead. These cases will usually occur when the token being shortened (or sacrificed) and the token being enlarged are at the lower end of their respective ranges, i.e., when a shortening results in dropping down to a smaller token, and/or the enlargement does not result in moving up to a larger one. In IBMLZ1 coding, new token sizes start at string lengths 2, 4, 8, 16 and 32. Whether or not the sacrifice is worthwhile is decided by comparing the sum of the sizes of the new tokens to that of the old.

For example, in the smart-parser view on the right hand side of FIG. 6 as described above, the first token went from length 12 (a 2-character string) to length 9 (a literal), while the second went from 12 bits (a 3-character string) to 14 bits (a 4-character string). Although the second token did increase in length its growth was more than compensated by the 3-bit drop in the length of the first token.

Below is shown an exemplary partial table of costs (based on the IBMLZ1 coding scheme) depending on how far the second string extends:

| second string reaches | Total cost greedy | Total cost alternative |
|---|---|---|
| 2 | (12 + 9) = 21 | (9 + 12) = 21 |
| 3 | (12 + 12) = 24 | (9 + 12) = 21 |
| 4 | (12 + 12) = 24 | (9 + 14) = 23 |
| 5 | (12 + 14) = 26 | (9 + 14) = 23 |
| 6 | (12 + 14) = 26 | (9 + 14) = 23 |
| 7 | (12 + 14) = 26 | (9 + 14) = 23 |
| 8 | (12 + 14) = 26 | (9 + 16) = 25 |
| 9 | (12 + 16) = 28 | (9 + 16) = 25 |
| . | | |
| . | | |
| . | | |
| 15 | (12 + 16) = 28 | (9 + 16) = 25 |
| 16 | (12 + 16) = 28 | (9 + 18) = 27 |
| . | | |
| 31 | (12 + 18) = 30 | (9 + 18) = 27 |
| 32 | (12 + 18) = 30 | (9 + 22) = 31 |
| 33 | (12 + 22) = 34 | (9 + 22) = 31 |
| . | | |
| . | | |

It is easy to see that the second choice is (almost) always as good as or better than the first, because the saving made by dropping the first match to a literal is rarely overtaken. So even though the encoder has no idea how the match will progress it can safely choose the second encoding method, knowing it is unlikely to be bettered.

The smart parser of the preferred embodiments of the present invention is thus not merely a "lazy" parser, of the type that is also known in the art. A lazy parser is one that scans one byte ahead in its byte-wise processing and can select any string that starts on that byte if the said string gives a longer match than one that starts on the current byte. The lazy parser performs no cost analysis to select a shortest total token length, as is done by the preferred embodiments of the present invention.

Even when the smart parsing produces the same size tokens as the greedy parsing method, it is usually better to pick the smart version. This is because the smart version produces a larger second token, which may extend beyond the current area of processing. Larger tokens have a wider string length range, and therefore have better chance of accommodating the larger string without increasing in size.

For example, if the processing for the current cycle finished at the end of the string "NING" in the right half of FIG. 6, it would not be known if that string finished at this point. All that would be known is that the matched string is at least 4 characters long. Even if the smart parsing was no better (did not produce the 1-bit saving) it would still be the best choice because the match pointed to by the second token can grow another three characters without having to increase in size. By contrast, the second token in the greedy choice on the left is already at its string length limit for its size, and must enlarge if it is to accommodate any growth in the matched string.

Of course, it is possible that the "smart" choice may not always be the best, when the string match finally completes. If the string ends up at a length that is the smallest length that its token size could represent, it can be seen with hindsight that it would be better not to choose the smart parsing option. But this will be rare with the larger tokens: on average only once in every 240 occasions with the largest IBMLZ1 token.

In general, the amount of forward-looking that is possible is dependent on the number of bytes processed in each cycle: the more bytes per cycle, the better the opportunities for spotting the most efficient coding.

Figure 9:
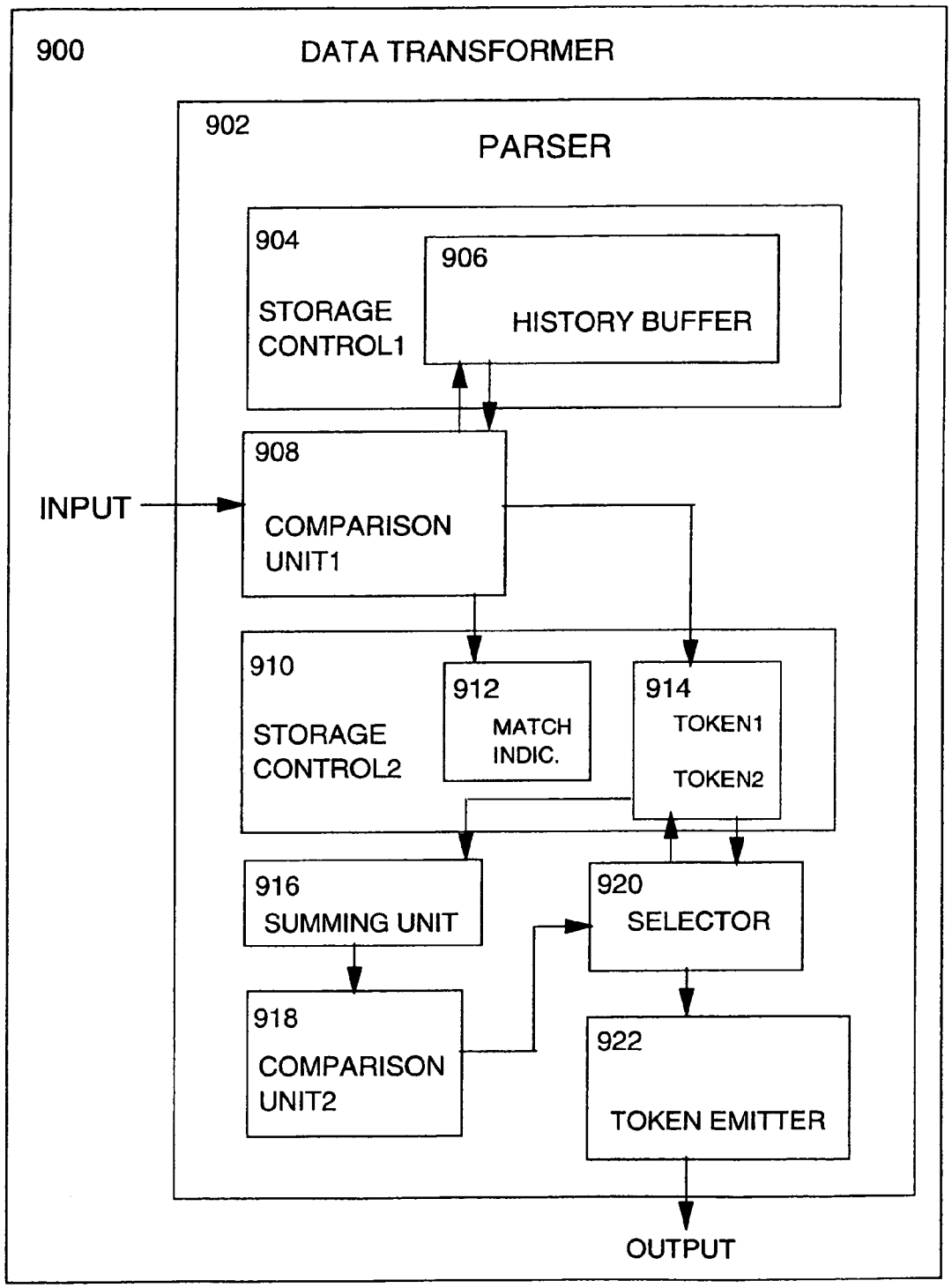
FIG. 9 is a block schematic diagram of the components of an apparatus according to a preferred embodiment of the present invention.

Turning now to FIG. 9 there is shown a data transformer apparatus (900) for transforming an input data stream having a parser (902). The parser (902) comprises a first storage component (904), which may be for example a random access memory, one or more software or hardware registers, a content-addressable memory or the like. First storage component (904) is operable to store a history buffer (906) for containing an unencoded version of at least one previously coded string. The parser also comprises a first comparison component (908) operable to compare a string from the input data stream with the unencoded version of the at least one previously coded string held in the history buffer (906)

The parser is provided with a second storage component (910), which is operable to store an indicator (912) that at least two matches were found by first comparison component (908) and tokens (914) corresponding to the at least two matches. The second storage component (910) may be for example a random access memory, one or more software or hardware registers, a content-addressable memory, or the like. The tokens (914) corresponding to the at least two matches have their lengths summed by a summing component (916), which provides an output indicating total potential token lengths for the tokens (914) corresponding to the at least two matches.

The parser further includes a second comparison component (918) which is operable to compare the total potential token lengths for the tokens (914) corresponding to the at least two matches. The output from second comparison component (918) is then used by selection component (920) to select matches corresponding to a shortest total token length to represent the string from said input data stream. The parser further includes an emitting component (922) for emitting tokens representing the matches corresponding to a shortest total token length.

It will be clear to one skilled in the art that the division into separate components shown in the exemplary illustration is not fixed, and that the components may be implemented in the form of one or more logic arrangements to provide functional equivalents of the components shown.

Although the described parser may be used in various contexts, the apparatus according to the preferred exemplary embodiment comprises data compression apparatus, preferably an adaptive dictionary based data compression apparatus, and most preferably a Lempel-Ziv data compression apparatus. However, it will be clear to one skilled in the art, that the operation of further embodiments in data encryption apparatus, message digest apparatus, and the like is contemplated. The possible range of embodiments of the present invention in all manner of parsing and tokenizing technologies will be clear to any person skilled in the computing art.

Figure 10:
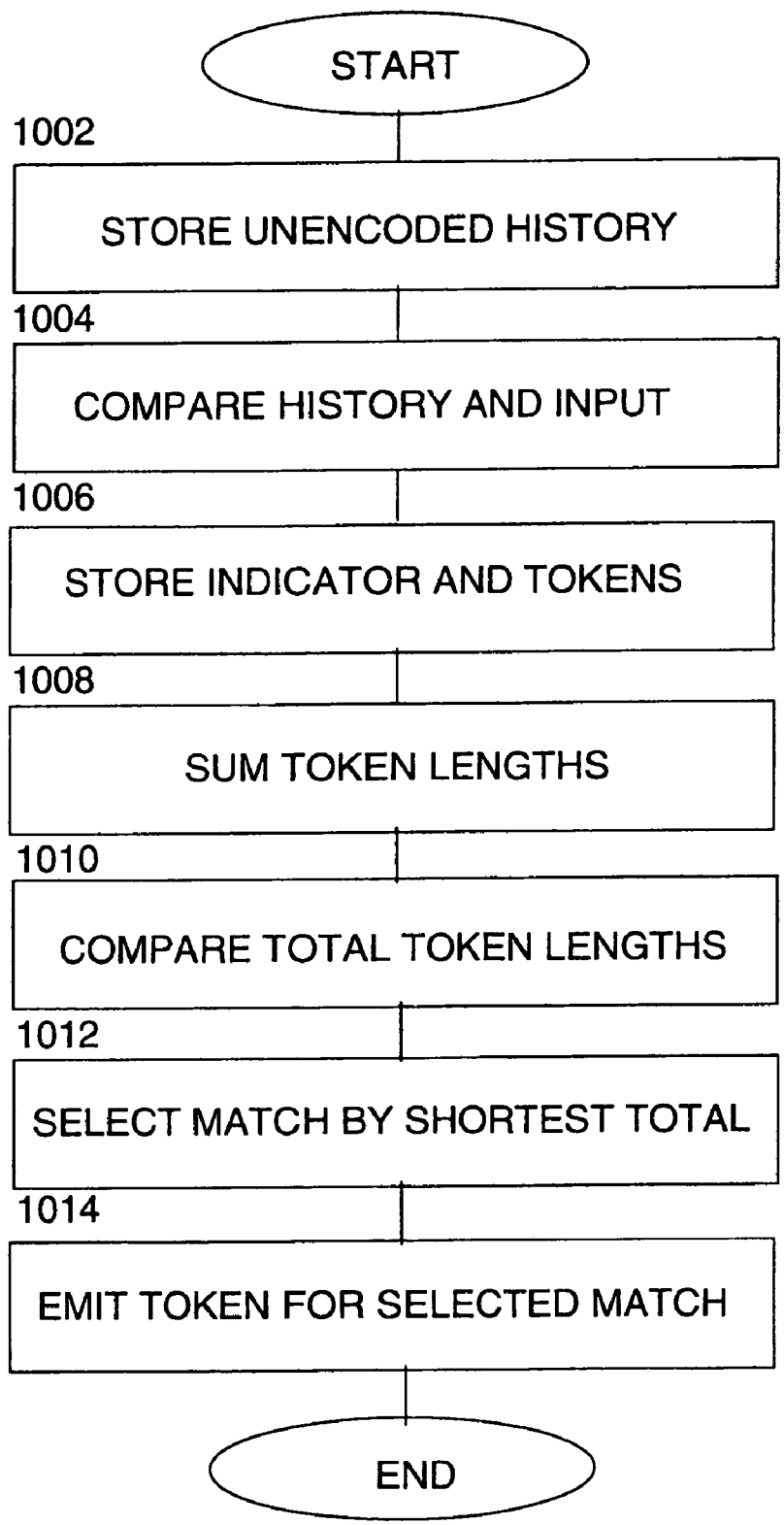
FIG. 10 is a flow chart illustrating the steps of a method of operating an apparatus or arrangement of apparatus according to a preferred embodiment of the present invention.

A method for operating an apparatus or arrangement of apparatus according to a preferred embodiment is shown in FIG. 10. FIG. 10 shows a method for parsing an input data stream comprising steps of storing (1002) a history buffer for containing an unencoded version of of at least one previously coded string, comparing (1004) a string from the input data stream with the at least one previously coded string, and storing (1006): an indicator that at least two matches were found during the step of comparing (1004), and tokens corresponding to said at least two matches. The method continues with steps of summing (1008) token lengths to provide potential total token lengths, comparing (1010) the potential total token lengths, selecting (1012) a match corresponding to a shortest potential total token length to represent the string from the input data stream, and emitting (1014) a token representing the matches corresponding to a shortest total token length.

The tokens of the preferred embodiment representing the matches corresponding to a shortest potential total token length comprise tokens in a token-based data compression scheme, preferably an adaptive dictionary based data compression scheme, and most preferably a Lempel-Ziv data compression scheme. However, it will be clear to one skilled in the art, that the operation of further embodiments in data encryption apparatus, message digest apparatus, and the like is contemplated. The possible range of embodiments of the present invention in all manner of parsing and tokenizing technologies will be clear to any person skilled in the computing art.

As will be immediately clear to one skilled in the art, provided that the functionality of each element of the above description is maintained, the same effect can be obtained in apparatus or in methods of operating apparatus in which, for example, the comparison units, or steps of comparing may use common apparatus elements or reused program code elements, and the divisions into blocks in the diagrams merely represent one exemplary embodiment of the present invention presented in this way for the purpose of making the description as simple as possible. In real world embodiments thereof, several possible divisions into device elements or common program code subroutines will be understood to be here contemplated by any person skilled in the art.

It will further be appreciated by one skilled in the art that the arrangement and method of the preferred embodiment described above will typically be carried out in hardware, for example in the form of an integrated circuit (not shown) such as an ASIC (Application Specific Integrated Integrated Circuit). In an alternative, the method may be carried out in computer program code to cause a suitable computer system to perform the steps of the method.

In software, the smart parsing technique may be implemented by string searching techniques considering several possible candidates an arbitrary number of bytes ahead, and selecting the most efficient coding.

For a hardware LZ1 implementation, as set forth herein in the description of the preferred exemplary embodiment, smart parsing cannot be employed unless plural bytes can be processed in each cycle. The amount of look-ahead that is possible depends on how many bytes are processed at a time. The more bytes processed the better the coding improvements, although the cost in gates increases using a square law. A presently most preferred implementation will now be described using three bytes, the unit that was disclosed as part of a twelve-byte-per-cycle processor in co-pending PCT patent application number WO/GB03/00388.

Figure 7:
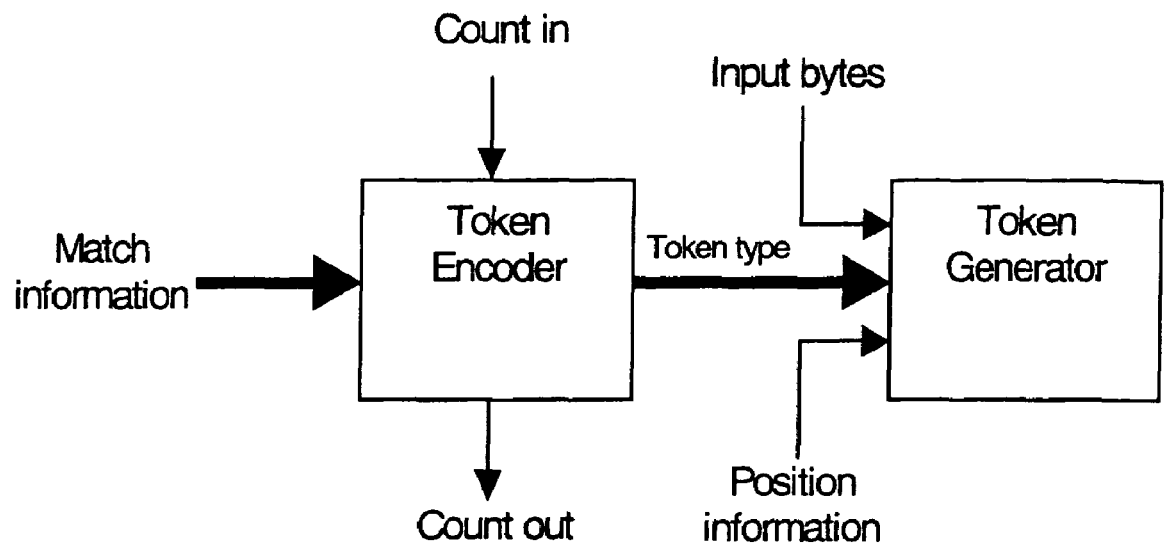
FIG. 7 shows an overview of the logic arrangement for efficient token encoding implementable to enhance the compression arrangement of FIG. 1.

Turning back now to the accompanying drawing figures, FIG. 7 shows an overview of the logic needed for one unit of encoding. The "Match information" is the information of how many potential strings exist in the (three) input rows. These strings have been gathered from all input columns and therefore represent the "winners", or best available string candidates for those three rows. In this example "Match information" consists of 6 signals; in general, using the counting mechanism of co-pending PCT patent application number WO/GB03/00388, the number of signals for a unit of size N is N(N+1)/2, where N is the number of input rows processed per cycle. The "Count in" is a tally of the length of any string that is carried from the unit above (in IBMLZ1 a string can be up to 271 characters). The "Count out" is the new value of that count if any string is not terminated in this unit, and is carried to the unit below (or stored for the next cycle).

"Token type" is an indication of what the Token Encoder has decided is the best coding to use. For instance, "token type" may indicate "output a literal, followed by a token of length 2". Or it may say "don't output anything yet" in cases where a string match continues over all 3 rows; it will simply increment the count by 3 and pass it down. Or it might say "output three literals" in cases where no viable strings have been found.

The Token Generator turns the "token type" information into a token. For this it will need a copy of the input bytes for these rows (for when a literal is required) or the positional information about winning strings. It combines all this information to produce a token indicating the correct length and history buffer address. A final unit (not shown) concatenates all the variable length information produced by this and other units into a packed token ready for storage.

The Token Encoder takes the form of a combinatorial Logic Array, where the output (Token type and Count out) is a function of the "Match information" combined with the "Count in".

This is the match information the token encoder uses to make its decision about the strings to encode. It can be seen that the encoder decides solely on the value of the 6-bit vector; furthermore, not all possible values are valid because of the fact that a row showing a match of n must also show a match of all values below n.

+-----true if row 2 has a match of more than 2
|
| X--true if row 1 has a match of more than 1
X X--true if row 2 has a match of 2 or more
X X X - - - true if row 3 has a match of 2 or more
| |
| +-----true if row 3 has a match of 3 or more
+-------true if row 3 has a match of more than 3

It is easy to see how this triangle should be expanded if more units are included in the comparison block.

Besides the 6-bit vector, the token encoder takes the following inputs:
1. The 'count' from the token encoder a 9-bit value;
2. The 3 9-bit addresses from the priority encoders in rows 0, 1 and 2. This is used if a token is generated for a match terminating in this row; and
3. The 3 input bytes for rows 0, 1 and 2. These are used when the encoder decides that a 'literal' must be output.

The token encoder outputs the following:
1. The 9-bit "count out" to the encoder below. This represents the length of the best string so far accumulated;
2. The token(s)/literal(s) generated for these three rows (if any), packed; and
3. Values showing the length of the string of tokens, so that they can be packed.

The following table shows a sample encoding line for the multi-byte variant of the co-pending PCT patent application number WO/GB03/00388. It shows a unit of three lines that employs a vector type as described above for the count indications.

| Match Information | Count In | Token type 1 | Token type 2 | Token type 3 | Count out |
|---|---|---|---|---|---|
| 0. 000 | 31 or 271 | Length of (Count in), terminating before row 1 | Length of 2, terminating at row 2 | — | 1 |
|  | Anything else | Length of (Count in + 1) terminating at row 1 | Literal of row 2 | — | 1 |

The "Match information" vector shows the following information:
1. The first row has a match that has continued from a carry in, but terminates there.
2. The second row has a match that started in the first row and finishes here (i.e. it "underlapped" the first row match).
3. There is no match in the third row, or a match of only one byte. The carry out of this unit will indicate if a single byte has been matched.

Figure 8:
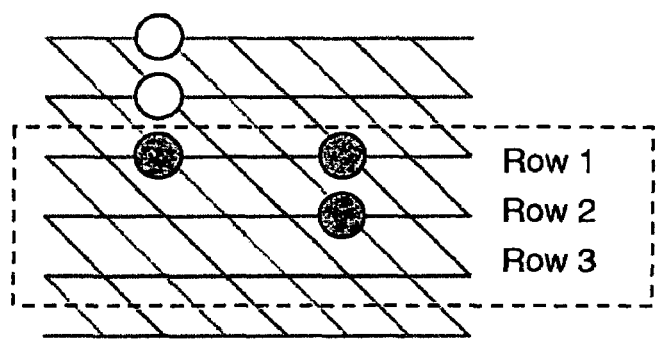
FIG. 8 shows a worked example of the matches found in a unit of 3 rows using the vector type of the compression arrangement of FIG. 1.

FIG. 8 shows the matches that this represents. The "underlap" means that there is a candidate for smart parsing: the match in row 1 may be considered either as part of the match carried in or may be joined to the second row for a match of 2 (with the other match considered terminated in the row above).

It can be seen that the best choice depends of the value of the count in. If the count in is 271, then the match is unable to continue anyway because the maximum token length has been reached, so this token must be emitted and the remaining match be coded as a token of length 2. This would be true for greedy parsing also.

For any count in less than 271, it would normally be best to append the first row match to the carried one, and simply emit the second row as a literal. But in the special case of count in being equal to 31, appending this match to the carried one would produce a token of string length 32, which pushes the IBMLZ1 coding scheme to the next size token (from 18 to 22 bits). When added to the literal cost (9 bits) this exceeds the alternative: that of leaving the carried string at length 31 (costing 18 bits) and emitting the token for the match of length 2 (12 bits). So for this value of count in, smart parsing will dictate a 31-length token followed by a 2-length one (22+9>18+12).

For both cases, the count out (to the unit below) is 1, indicating that there is a potential match of no more than 1 carried forward. The full encoding matrix for this example uses another 13 decisions similar to those shown in the example encoding line hereinabove, representing the 14 valid combinations of the Match information vector.

It should be noted that designing the Token Encoder in FIG. 7 to produce "smart" type encodings in a hardware embodiment advantageously costs approximately the same number of gates as producing greedy ones. Thus the savings advantageously come at little or no cost in logic gates. The amount of improvement in compression efficiency that is achievable is dependent both on the nature of the data and the number of bytes that are considered ("processed" in hardware) at a time. More bytes per processing cycle will produce greater opportunities for improvement.

It will be appreciated that the method described above may be carried out in software running on one or more processors (not shown), and that the software may be provided as a computer program element carried on any suitable data carrier (also not shown) such as a magnetic or optical computer disc. The channels for the transmission of data likewise may include storage media of all descriptions as well as signal carrying media, such as wired or wireless signal media.

The present invention may suitably be embodied as a computer program product for use with a computer system. Such an implementation may comprise a series of computer readable instructions either fixed on a tangible medium, such as a computer readable medium, for example, diskette, CD-ROM, ROM, or hard disk, or transmittable to a computer system, via a modem or other interface device, over either a tangible medium, including but not limited to optical or analogue communications lines, or intangibly using wireless techniques, including but not limited to microwave, infrared or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink-wrapped software, pre-loaded with a computer system, for example, on a system ROM or fixed disk, or distributed from a server or electronic bulletin board over a network, for example, the Internet or World Wide Web.

It will be appreciated that various modifications to the embodiment described above will be apparent to a person of ordinary skill in the art.

What is claimed is:

1. A method for parsing an input data stream, comprising:
    storing a history buffer for containing an unencoded version of at least one previously encoded string;
    comparing a string from said input data stream with said unencoded version of at least one previously encoded string to identify matches between character strings in the string from said input data stream and character strings in the unencoded version of the at least one previously encoded string;
    storing: an indicator that there exist at least two matches identified, and potential tokens corresponding to said at least two matches for a plurality of alternate encodings;
    for each alternate encoding in the plurality of alternate encodings, summing lengths of the potential tokens in the alternate encoding to provide a total potential token length for the alternate encoding;
    comparing said total potential token lengths to determine a shortest total potential token length;
    selecting an encoding corresponding to the shortest total potential token length; and
    generating encoding information representing said selected encoding.

2. A method as claimed in claim 1, wherein said tokens comprise compressed data corresponding to said at least two matches.

3. A method as claimed in claim 2, wherein said compressed data comprises adaptive dictionary based compressed data.

4. A method as claimed in claim 1, wherein said tokens comprise encrypted data corresponding to said at least two matches.

5. A method as claimed in claim 1, wherein said tokens comprise message digest data corresponding to said at least two matches.

6. The method of claim 1, where the encoding information comprises instructions to at least one of output a literal and output a token.

7. The method of claim 1, where the length of a token depends on a length of a matched character string.

8. The method of claim 1, further comprising generating an encoded version of the string from the input data stream based on the encoding information.

9. A method to parse an input data stream that comprises a string, comprising:
    storing an unencoded version of at least one previously encoded string;
    comparing a string received from the input data stream with the stored unencoded version of at least one previously encoded string to determine a case where there exist a selected plurality of alternate encodings of the string received from the input data stream;
    determining tokens corresponding to each alternate encoding in the plurality of alternate encodings;
    for each alternate encoding in the plurality of alternate encodings, summing lengths of the tokens corresponding to an alternate encoding to determine a total potential token length for the alternate encoding; and
    outputting encoding information corresponding to an alternate encoding having a shortest total potential token length.

10. The method of claim 9, where the encoding information comprises instructions to at least one of output a literal and output a token.

11. The method of claim 9, where the length of a token depends on a length of a character string.

12. The method of claim 9, further comprising generating an encoded version of the string received from the input data stream based on the encoding information.

13. A method as claimed in claim 12, wherein the encoded version comprises compressed data.

14. A method as claimed in claim 13, wherein the compressed data comprises adaptive dictionary based compressed data.

15. A method as claimed in claim 12, wherein the encoded version comprises encrypted data.

16. A method as claimed in claim 12, wherein the encoded version comprises message digest data.

* * * * *